United States Patent
Liu

(10) Patent No.: US 10,192,908 B2
(45) Date of Patent: Jan. 29, 2019

(54) TFT ARRAY MANUFACTURING METHOD OF OPTIMIZED 4M PRODUCTION PROCESS

(71) Applicant: Shenzhen China Star Optoelectronics Technology Co., Ltd., Shenzhen (CN)

(72) Inventor: Xiaodi Liu, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 59 days.

(21) Appl. No.: 15/529,503

(22) PCT Filed: Apr. 14, 2017

(86) PCT No.: PCT/CN2017/080508
§ 371 (c)(1),
(2) Date: May 25, 2017

(87) PCT Pub. No.: WO2018/170972
PCT Pub. Date: Sep. 27, 2018

(65) Prior Publication Data
US 2018/0308879 A1    Oct. 25, 2018

(30) Foreign Application Priority Data

Mar. 22, 2017    (CN) .......................... 2017 1 0175687

(51) Int. Cl.
*H01L 27/32*    (2006.01)
*H01L 27/12*    (2006.01)
*H01L 29/786*    (2006.01)

(52) U.S. Cl.
CPC ........ *H01L 27/1288* (2013.01); *H01L 27/127* (2013.01); *H01L 27/1225* (2013.01); *H01L 27/1292* (2013.01); *H01L 29/7869* (2013.01)

(58) Field of Classification Search
None
See application file for complete search history.

(56) References Cited

U.S. PATENT DOCUMENTS 7,985,605 B2 *   7/2011   Komori ............... H01L 27/1214
                                                                 438/22
8,536,571 B2 *   9/2013   Yamazaki ........... H01L 29/7869
                                                                 257/43

(Continued)

FOREIGN PATENT DOCUMENTS

CN         105097671 A    11/2015
CN         105304643 A     2/2016

*Primary Examiner* — Michael Lebentritt
(74) *Attorney, Agent, or Firm* — Leong C. Lei

(57) ABSTRACT

The present invention provides a TFT array manufacturing method of an optimized 4M production process. The method includes: Step 10, in a first mask-based process, making a gate layer on a glass substrate and patterning the gate layer; Step 20, in a second mask-based process, subjecting the photoresist layer to exposure and development; conducting a first wet etching operation to pattern the source/drain layer; conducting a first oxygen ashing operation to reduce a size of trailing of the active layer on edges of the source/drain metal layer; conducing a first dry etching operation to form an active layer island structure; conducting a second oxygen ashing operation to expose portions of the source/drain layer in the channel area; conducting a second wet etching operation to pattern a source and a drain; conducting a third oxygen ashing operation to reduce trailing of the contact layer; and conducting a second dry etching operation to etch the active layer; Step 30, in a third mask-based process, making a passivation layer followed by patterning; and Step (Continued)

40, in a fourth mask-based process, making a transparent electrode layer followed by patterning. The present invention allows for, on the basis of an existing production process, successful elimination of heavily doped residue in a channel area (by reducing around 0.9 um) and reducing around 1 um in an amorphous silicon area.

18 Claims, 3 Drawing Sheets

(56) References Cited

U.S. PATENT DOCUMENTS

| | | | | |
|---|---|---|---|---|
| 2004/0157166 A1* | 8/2004 | Liu | | G03F 7/40 |
| | | | | 430/316 |
| 2007/0020903 A1 | 1/2007 | Takehara et al. | | |
| 2007/0272355 A1* | 11/2007 | Kido | | G03F 7/2022 |
| | | | | 156/345.1 |
| 2010/0002173 A1* | 1/2010 | Otani | | G02F 1/133555 |
| | | | | 349/114 |
| 2010/0012945 A1* | 1/2010 | Zheng | | H01L 21/0272 |
| | | | | 257/72 |
| 2012/0099058 A1* | 4/2012 | Qin | | H01L 27/1288 |
| | | | | 349/106 |
| 2012/0235138 A1* | 9/2012 | Shieh | | H01L 27/1225 |
| | | | | 257/43 |
| 2012/0241748 A1* | 9/2012 | Fujii | | G02F 1/136286 |
| | | | | 257/59 |
| 2012/0280239 A1* | 11/2012 | Liu | | H01L 27/1225 |
| | | | | 257/59 |
| 2013/0162925 A1* | 6/2013 | Wang | | H01L 27/1288 |
| | | | | 349/43 |
| 2013/0334502 A1* | 12/2013 | Liu | | H01L 27/3265 |
| | | | | 257/40 |
| 2016/0020329 A1* | 1/2016 | Koezuka | | H01L 29/7869 |
| | | | | 257/43 |
| 2016/0190184 A1* | 6/2016 | Imamura | | H01L 27/1225 |
| | | | | 257/43 |
| 2016/0247821 A1* | 8/2016 | Li | | H01L 29/78642 |
| 2017/0162708 A1* | 6/2017 | Ge | | H01L 29/78663 |
| 2017/0294465 A1* | 10/2017 | Pei | | H01L 21/027 |
| 2018/0211888 A1* | 7/2018 | Liu | | H01L 21/02271 |

* cited by examiner

TFT ARRAY MANUFACTURING METHOD OF OPTIMIZED 4M PRODUCTION PROCESS

BACKGROUND OF THE INVENTION

1. Field of the Invention

The present invention relates to the field of liquid crystal displays, and more particular to a thin-film transistor (TFT) array manufacturing method of an optimized 4M (Four-Mask) production process.

2. The Related Arts

Flat panel display devices, such as liquid crystal displays (LCDs), have various advantages, such as high image quality, low power consumption, thin device body, and a wide range of applications, and are thus widely used in various consumer electronic products, such as mobile phones, televisions, personal digital assistants (PDAs), digital cameras, notebook computers, and desktop computers, making them a main stream of display devices.

To reduce costs and increase yield, manufacturers and research institutes of display array substrates have devoted themselves to continuous development of new processes and techniques of production, among which 4M (four masks) processes have taken the place of 5M (five masks) processes and become the new trend of study and production in this field. The 4M production processes suffer issue of residues of amorphous silicon and heavily doped silicon on edges of a second layer of metal, where the second layer of metal is the metal of source/drain metal layer. Such issues affect optical stability and electrical performance, aperture ratio, power consumption, and reliability of thin-film transistors (TFT). This is caused by a patterning operation conducted with a half-tone mask (HTM) or a gray-tone mask (GTM).

Referring to FIG. 1, which is a schematic view illustrating a conventional 4M production process, a second mask-based process of the conventional 4M production process is demonstrated. The conventional 4M production process generally comprises the following:

a first mask-based process, in which a gate layer 12 is formed on a glass substrate 11 and the gate layer 12 is patterned; and then, a gate insulation layer 13, an active layer, a source/drain layer 16, and a photoresist layer 17 are formed, wherein the active layer comprises a channel layer 14 and a contact layer 15;

a second mask-based process, in which a gray-tone mask is used as a second mask to subject the photoresist layer 17 to exposure and development; a first wet etching operation is carried out to pattern the source/drain layer 16 to form metal lines structures of source and drain areas and an active area; a first dry etching operation is carried out to form an island structure of the active layer, namely patterned channel layer 14 and contact layer 15; an oxygen ashing operation is carried out to reduce the thickness of the photoresist layer 17 in order to expose the source/drain layer 16 in the channel area; a second wet etching operation is conducted to pattern the source and drain electrodes; and a second dry etching operation is applied to etch the active layer, namely etching and cutting off the channel layer 14 and the contact layer 15 to form a thin-film transistor structure;

a third mask-based process, in which a passivation layer is formed and the passivation layer is patterned; and a fourth mask-based process, in which a transparent electrode layer is formed and the transparent electrode layer is patterned.

In view of the problems of residues of amorphous silicon and heavily doped silicon on edges of the second layer of metal occurring in the conventional 4M production process, there is a need to provide a TFT array manufacturing method of an optimized 4M production process.

SUMMARY OF THE INVENTION

An objective of the present invention is to alleviate or eliminate the problems of residues of amorphous silicon and heavily doped silicon on edges of second layer of meta by varying a production process involved.

To achieve the above objective, the present invention provides a TFT array manufacturing method of an optimized 4M production process, which comprises:

Step 10: in a first mask-based process, making a gate layer on a glass substrate and patterning the gate layer; and then, making a gate insulation layer, an active layer, a source/drain layer, and a photoresist layer;

Step 20: in a second mask-based process, subjecting the photoresist layer to exposure and development; conducting a first wet etching operation to pattern the source/drain layer to form metal line structures of source and drain areas and an active area; conducting a first oxygen ashing operation to reduce a size of trailing of the active layer on edges of the source/drain metal layer; conducting a first dry etching operation to form an active layer island structure; conducting a second oxygen ashing operation to reduce a thickness of the photoresist layer in order to expose portions of the source/drain layer in a channel area; conducting a second wet etching operation to pattern a source and a drain; conducting a third oxygen ashing operation to reduce trailing of the contact layer; and conducting a second dry etching operation to etch the active layer so as to form a thin-film transistor structure;

Step 30: in a third mask-based process, making a passivation layer and patterning the passivation layer; and Step 40: in a fourth mask-based process, making a transparent electrode layer and patterning the transparent electrode layer.

In the above method, the TFT array is a TFT array of a display zone or a gate-driver-on-array (GOA) circuit zone.

In the above method, the second mask comprises a gray-tone mask or a half-tone mask.

In the above method, the making of the gate layer is conducted through puttering, a sol-gel process, atomic layer deposition, evaporation, or printing.

In the above method, a material of the gate layer comprises Cu, Cu/Mo, Mo/Cu/Mo, MoNb/Cu/MoNb, Ti/Cu/Ti, Al, Al/Mo, or Mo/Al/Mo.

In the above method, the making of the gate insulation layer is conducted through plasma enhanced chemical vapor deposition, atmospheric pressure chemical vapor deposition, or sputtering.

In the above method, a material of the gate insulation layer comprises silicon nitride, silicon oxide, silicon oxynitride, aluminum oxide, or hafnium oxide.

In the above method, the active layer comprises a channel layer and a contact layer.

In the above method, the channel layer and the contact layer are formed through depositing a silicon base and conducting sputtering to form a metal oxide semiconductor layer or conducting atomic layer deposition to form a metal oxide semiconductor layer.

In the above method, the metal oxide comprises indium gallium zinc oxide (IGZO), indium zinc oxide (IZO), or indium tin zinc oxide (ITZO).

The present invention also provides a TFT array manufacturing method of an optimized 4M production process, which comprises:

Step 10: in a first mask-based process, making a gate layer on a glass substrate and patterning the gate layer; and then, making a gate insulation layer, an active layer, a source/drain layer, and a photoresist layer;

Step 20: in a second mask-based process, subjecting the photoresist layer to exposure and development; conducting a first wet etching operation to pattern the source/drain layer to form metal line structures of source and drain areas and an active area; conducting a first oxygen ashing operation to reduce a size of trailing of the active layer on edges of the source/drain metal layer; conducting a first dry etching operation to form an active layer island structure; conducting a second oxygen ashing operation to reduce a thickness of the photoresist layer in order to expose portions of the source/drain layer in a channel area; conducting a second wet etching operation to pattern a source and a drain; conducting a third oxygen ashing operation to reduce trailing of the contact layer; and conducting a second dry etching operation to etch the active layer so as to form a thin-film transistor structure;

Step 30: in a third mask-based process, making a passivation layer and patterning the passivation layer; and Step 40: in a fourth mask-based process, making a transparent electrode layer and patterning the transparent electrode layer;

wherein the TFT array is a TFT array of a display zone or a gate-driver-on-array (GOA) circuit zone; and wherein the second mask comprises a gray-tone mask or a half-tone mask.

In summary, the present invention provides a TFT array manufacturing method of an optimized 4M production process, which additionally includes to oxygen ashing steps on the basis of a known, original production process so that these steps are conducted in the same chambers of the original production process without the need of using separate machines thereby helping reducing cost and improving yield, and achieving the advantages of improving optical stability and electrical performance, aperture ratio and reliability, and reducing power consumption of TFTs to thus improve overall performance of an array substrate, allowing for elimination of heavily doped residues in the channel area (by reducing around 0.9 um) and reducing around 1 um in an amorphous silicon area.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

Figure 3:
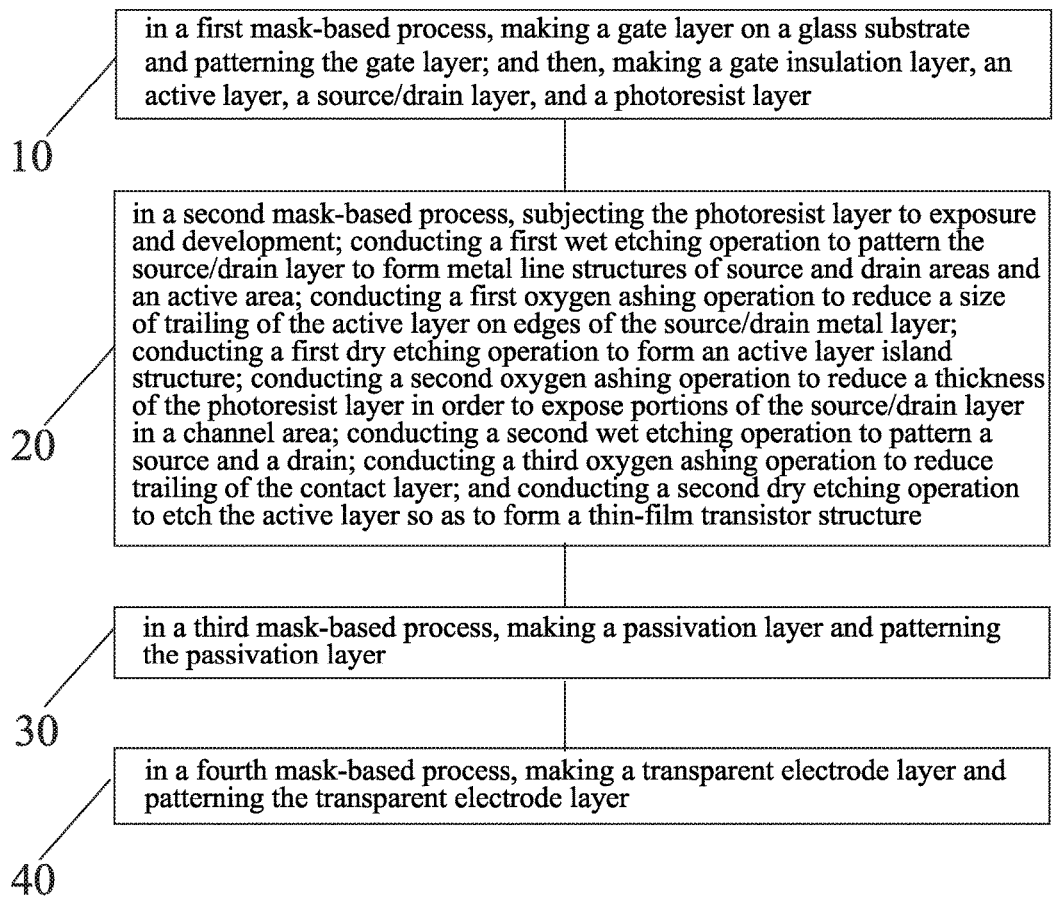
FIG. 3 is a flow chart illustrating the TFT array manufacturing method of the optimized 4M production process according to the present invention.

FIG. 3 is a flow chart illustrating a thin-film transistor (TFT) array manufacturing method of an optimized 4M (Four-Mask) production process according to the present invention. The manufacturing method generally comprises:

Step 10: in a first mask-based process, making a gate layer on a glass substrate and patterning the gate layer; and then, making a gate insulation layer, an active layer, a source/drain layer, and a photoresist layer;

Step 20: in a second mask-based process, subjecting the photoresist layer to exposure and development; conducting a first wet etching operation to pattern the source/drain layer to form metal line structures of source and drain areas and an active area; conducting a first oxygen ashing operation to reduce a size of trailing of the active layer on edges of the source/drain metal layer; conducting a first dry etching operation to form an active layer island structure; conducting a second oxygen ashing operation to reduce a thickness of the photoresist layer in order to expose portions of the source/drain layer in a channel area; conducting a second wet etching operation to pattern a source and a drain; conducting a third oxygen ashing operation to reduce trailing of the contact layer; and conducting a second dry etching operation to etch the active layer so as to form a thin-film transistor structure;

Step 30: in a third mask-based process, making a passivation layer and patterning the passivation layer; and Step 40: in a fourth mask-based process, making a transparent electrode layer and patterning the transparent electrode layer.

The present invention relates to the development of a backplane of optimized 4M production art, which is applicable to the development and display of a TFT array in a display zone or a gate-driver-on-array (GOA) circuit zone and optimization of circuit performance. The present invention comprises making of gate electrode, which can be achieved by applying methods such as sputtering, sol-gel process, atomic layer deposition, evaporation, and printing to make an electrode material, such as Cu, Cu/Mo, Mo/Cu/Mo, MoNb/Cu/MoNb, Ti/Cu/Ti, Al, Al/Mo, and Mo/Al/Mo, followed by patterning. The present invention comprises making of a gate insulation layer, which specifically comprises applying plasma enhanced chemical vapor deposition, atmospheric pressure chemical vapor deposition, or sputtering to make a dielectric material, such as silicon nitride, silicon oxide, silicon oxynitride, aluminum oxide, and hafnium oxide. The present invention comprises depositing a silicon base and depositing, through sputtering and atomic layer deposition, a metal oxide semiconductor layer, such as indium gallium zinc oxide (IGZO), indium zinc oxide (IZO), and indium tin zinc oxide (ITZO) to form the channel layer and the contact layer. The second mask can be a gray-tone mask or a half-tone mask. Deposition of the passivation layer, etching of contact holes, and extending of the transparent electrode, such as indium tin oxide (ITO), conducted in Steps 30 and 40 can be carried out with known techniques and repeated description will be omitted herein.

Figure 1:
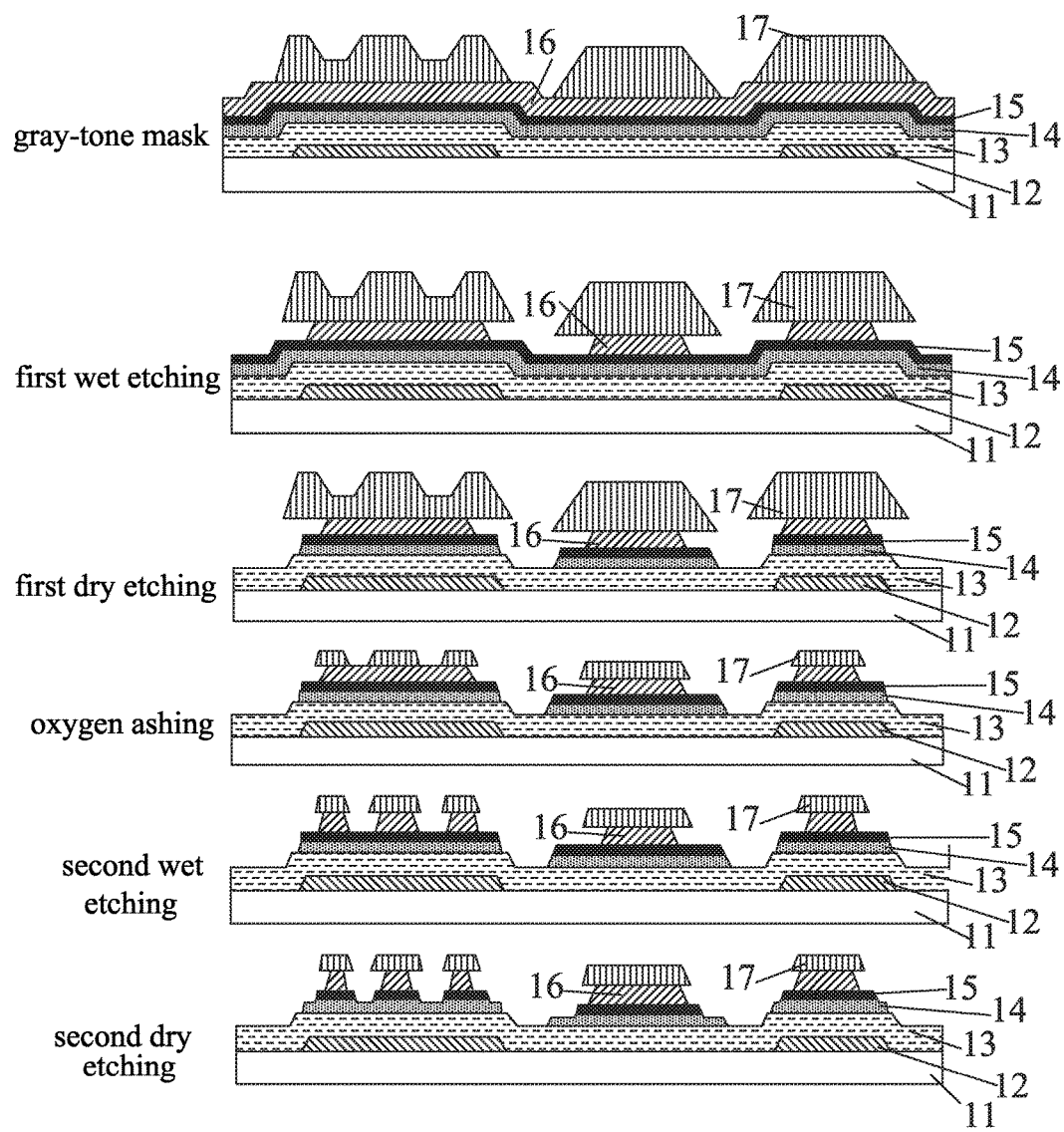
FIG. 1 is a schematic view demonstrating a conventional 4M production process.
Figure 2:
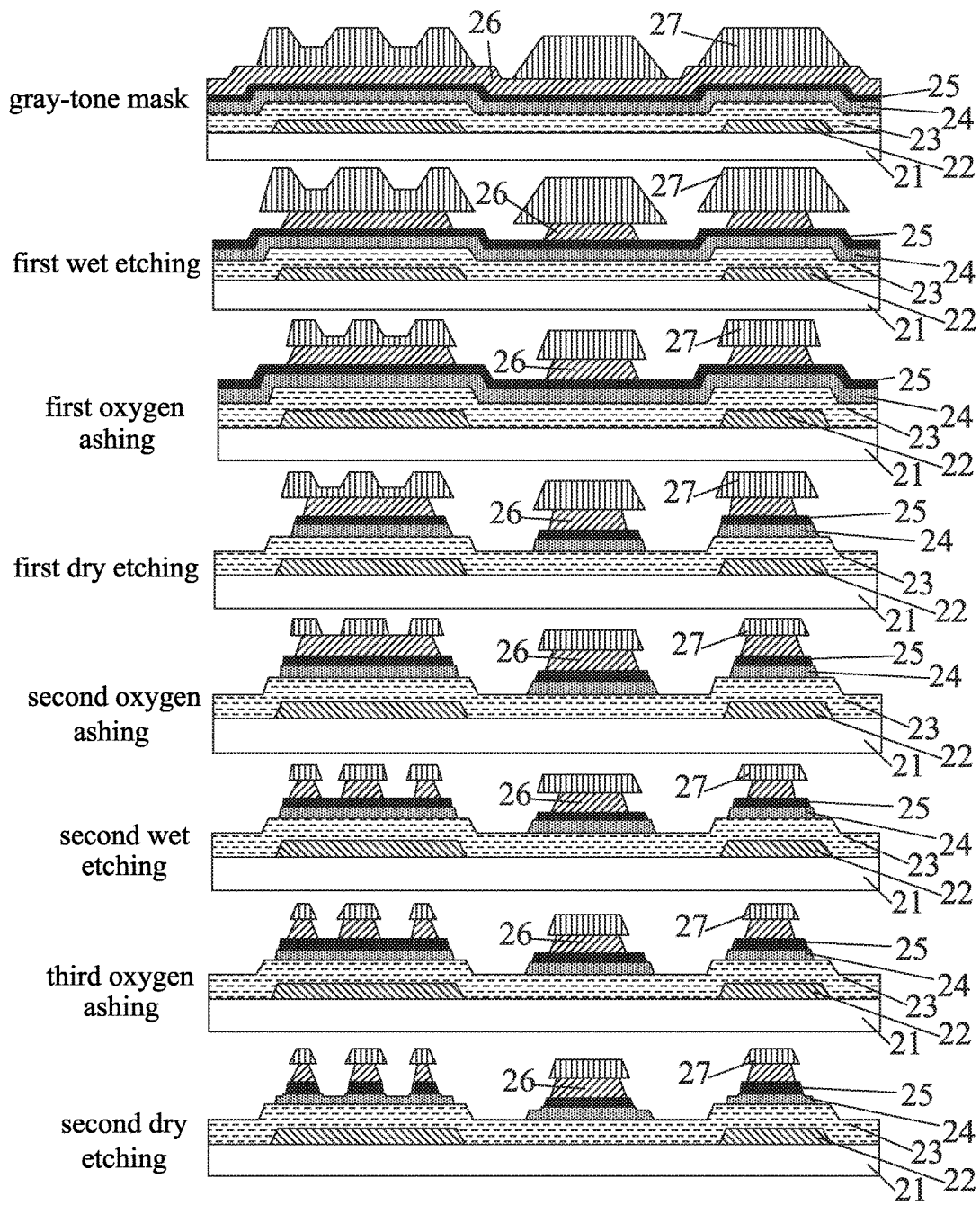
FIG. 2 is a schematic view demonstrating a TFT array manufacturing method of an optimized 4M production process according to the present invention.

Referring to FIG. 2, a schematic view of the TFT array manufacturing method of the optimized 4M production process according to the present invention is shown to demonstrate the second mask-based process, which is the novel part of the present invention that improves and optimizes the known process.

In the first mask-based process conducted before the second mask-based process, the gate layer 22 is made on the glass substrate 21 and the gate layer 22 is patterned; and then, the gate insulation layer 23, the active layer, the source/drain layer 26, and the photoresist layer 27 are made, wherein the active layer comprises the channel layer 24 and the contact layer 25. Afterwards, in the second mask-based process that uses a gray-tone mask:

applying the gray-tone mask to subject the photoresist layer 27 to exposure and development;

conducting the first wet etching operation to pattern the source/drain layer 26 to form the metal line structures of the source and drain areas and the active area;

conducting the first oxygen ashing operation to reduce the size of the trailing of the active layer on edges of the source/drain metal layer 26, wherein the purpose of additionally including this oxygen ashing operation is to reduce residue of amorphous silicon;

conducting the first dry etching operation to form the active layer island structure, which is patterning of the channel layer 24 and the contact layer 25;

conducting the second oxygen ashing operation to reduce the thickness of the photoresist layer 27 in order to expose the portions of the source/drain layer 16 in the channel area;

conducting the second wet etching operation to pattern the source and the drain;

conducting the third oxygen ashing operation to reduce the trailing of he contact layer, wherein the purpose of additionally including this oxygen ashing operation is to reduce residue of heavily doped silicon; and conducting the second dry etching operation to etch the active layer, which is etching and cutting off the channel layer 24 and the contact layer 25 to form the thin-film transistor structure.

In summary, the present invention provides a TFT array manufacturing method of an optimized 4M production process, which additionally includes to oxygen ashing steps on the basis of a known, original production process so that these steps are conducted in the same chambers of the original production process without the need of using separate machines thereby helping reducing cost and improving yield, and achieving the advantages of improving optical stability and electrical performance, aperture ratio and reliability, and reducing power consumption of TFTs to thus improve overall performance of an array substrate, allowing for elimination of heavily doped residues in the channel area (by reducing around 0.9 um) and reducing around 1 um in an amorphous silicon area.

Based on the description given above, those having ordinary skills in the art may easily contemplate various changes and modifications of the technical solution and the technical ideas of the present invention. All these changes and modifications are considered falling within the protection scope of the present invention as defined in the appended claims.

What is claimed is:

1. A thin-film transistor (TFT) array manufacturing method of an optimized 4M production process, comprising:

Step 10: in a first mask-based process, making a gate layer on a glass substrate and patterning the gate layer; and then, making a gate insulation layer, an active layer, a source/drain layer, and a photoresist layer;

Step 20: in a second mask-based process, subjecting the photoresist layer to exposure and development; conducting a first wet etching operation to pattern the source/drain layer to form metal line structures of source and drain areas and an active area; conducting a first oxygen ashing operation to reduce a size of trailing of the active layer on edges of the source/drain metal layer; conducting a first dry etching operation to form an active layer island structure; conducting a second oxygen ashing operation to reduce a thickness of the photoresist layer in order to expose portions of the source/drain layer in a channel area; conducting a second wet etching operation to pattern a source and a drain; conducting a third oxygen ashing operation to reduce trailing of the contact layer; and conducting a second dry etching operation to etch the active layer so as to form a thin-film transistor structure;

Step 30: in a third mask-based process, making a passivation layer and patterning the passivation layer; and Step 40: in a fourth mask-based process, making a transparent electrode layer and patterning the transparent electrode layer.

2. The TFT array manufacturing method of the optimized 4M production process as claimed in claim 1, wherein the TFT array is a TFT array of a display zone or a gate-driver-on-array (GOA) circuit zone.

3. The TFT array manufacturing method of the optimized 4M production process as claimed in claim 1, wherein the second mask comprises a gray-tone mask or a half-tone mask.

4. The TFT array manufacturing method of the optimized 4M production process as claimed in claim 1, wherein the making of the gate layer is conducted through puttering, a sol-gel process, atomic layer deposition, evaporation, or printing.

5. The TFT array manufacturing method of the optimized 4M production process as claimed in claim 4, wherein a material of the gate layer comprises Cu, Cu/Mo, Mo/Cu/Mo, MoNb/Cu/MoNb, Ti/Cu/Ti, Al, Al/Mo, or Mo/Al/Mo.

6. The TFT array manufacturing method of the optimized 4M production process as claimed in claim 1, wherein the making of the gate insulation layer is conducted through plasma enhanced chemical vapor deposition, atmospheric pressure chemical vapor deposition, or sputtering.

7. The TFT array manufacturing method of the optimized 4M production process as claimed in claim 6, wherein a material of the gate insulation layer comprises silicon nitride, silicon oxide, silicon oxynitride, aluminum oxide, or hafnium oxide.

8. The TFT array manufacturing method of the optimized 4M production process as claimed in claim 1, wherein the active layer comprises a channel layer and a contact layer.

9. The TFT array manufacturing method of the optimized 4M production process as claimed in claim 8, wherein the channel layer and the contact layer are formed through depositing a silicon base and conducting sputtering to form a metal oxide semiconductor layer or conducting atomic layer deposition to form a metal oxide semiconductor layer.

10. The TFT array manufacturing method of the optimized 4M production process as claimed in claim 9, wherein the metal oxide comprises indium gallium zinc oxide (IGZO), indium zinc oxide (IZO), or indium tin zinc oxide (ITZO).

11. A thin-film transistor (TFT) array manufacturing method of an optimized 4M production process, comprising:

Step 10: in a first mask-based process, making a gate layer on a glass substrate and patterning the gate layer; and then, making a gate insulation layer, an active layer, a source/drain layer, and a photoresist layer;

Step 20: in a second mask-based process, subjecting the photoresist layer to exposure and development; conducting a first wet etching operation to pattern the source/drain layer to form metal line structures of source and drain areas and an active area; conducting a first oxygen ashing operation to reduce a size of trailing of the active layer on edges of the source/drain metal layer; conducting a first dry etching operation to form an active layer island structure; conducting a second oxygen ashing operation to reduce a thickness of the photoresist layer in order to expose portions of the source/drain layer in a channel area; conducting a second wet etching operation to pattern a source and a drain; conducting a third oxygen ashing operation to reduce trailing of the contact layer; and conducting a second dry etching operation to etch the active layer so as to form a thin-film transistor structure;

Step 30: in a third mask-based process, making a passivation layer and patterning the passivation layer; and Step 40: in a fourth mask-based process, making a transparent electrode layer and patterning the transparent electrode layer;

wherein the TFT array is a TFT array of a display zone or a gate-driver-on-array (GOA) circuit zone; and wherein the second mask comprises a gray-tone mask or a half-tone mask.

12. The TFT array manufacturing method of the optimized 4M production process as claimed in claim 11, wherein the making of the gate layer is conducted through puttering, a sol-gel process, atomic layer deposition, evaporation, or printing.

13. The TFT array manufacturing method of the optimized 4M production process as claimed in claim 12, wherein a material of the gate layer comprises Cu, Cu/Mo, Mo/Cu/Mo, MoNb/Cu/MoNb, Ti/Cu/Ti, Al, Al/Mo, or Mo/Al/Mo.

14. The TFT array manufacturing method of the optimized 4M production process as claimed in claim 11, wherein the making of the gate insulation layer is conducted through plasma enhanced chemical vapor deposition, atmospheric pressure chemical vapor deposition, or sputtering.

15. The TFT array manufacturing method of the optimized 4M production process as claimed in claim 14, wherein a material of the gate insulation layer comprises silicon nitride, silicon oxide, silicon oxynitride, aluminum oxide, or hafnium oxide.

16. The TFT array manufacturing method of the optimized 4M production process as claimed in claim 11, wherein the active layer comprises a channel layer and a contact layer.

17. The TFT array manufacturing method of the optimized 4M production process as claimed in claim 16, wherein the channel layer and the contact layer are formed through depositing a silicon base and conducting sputtering to form a metal oxide semiconductor layer or conducting atomic layer deposition to form a metal oxide semiconductor layer.

18. The TFT array manufacturing method of the optimized 4M production process as claimed in claim 17, wherein the metal oxide comprises indium gallium zinc oxide (IGZO), indium zinc oxide (IZO), or indium tin zinc oxide (ITZO).

* * * * *